(12) United States Patent
Fujiwara et al.

(10) Patent No.: US 6,781,246 B2
(45) Date of Patent: Aug. 24, 2004

(54) SEMICONDUCTOR ARRAY DEVICE WITH SINGLE INTERCONNECTION LAYER

(75) Inventors: Hiroyuki Fujiwara, Hachioji (JP); Masumi Taninaka, Hachioji (JP); Susumu Ozawa, Hachioji (JP); Masumi Koizumi, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 10/631,893

(22) Filed: Aug. 1, 2003

(65) Prior Publication Data

US 2004/0021146 A1 Feb. 5, 2004

(30) Foreign Application Priority Data

Aug. 2, 2002 (JP) ........................................ 2002-225865

(51) Int. Cl.[7] .............................................. H01L 23/48

(52) U.S. Cl. ........................ 257/780; 257/503; 257/700; 257/734; 257/776; 257/781

(58) Field of Search ................................. 257/503, 700, 257/734, 776, 780, 781

(56) References Cited

U.S. PATENT DOCUMENTS 6,356,448 B1 * 3/2002 DiBene et al. ............... 361/721

FOREIGN PATENT DOCUMENTS

JP      2001-77431      3/2001

* cited by examiner

Primary Examiner—Fetsum Abraham
(74) Attorney, Agent, or Firm—Rabin & Berdo, PC

(57) ABSTRACT

An array of semiconductor circuit elements such as light-emitting elements includes a semiconductor layer partially covered by a dielectric film. A first interconnecting pad such as a wire-bonding pad is electrically coupled by conductive paths passing through the semiconductor layer to electrodes of a first group of semiconductor circuit elements formed in the semiconductor layer. A second interconnecting pad such as a wire-bonding pad, formed on the dielectric film, is electrically coupled to electrodes of a second group of semiconductor circuit elements formed in the semiconductor layer by conductive paths insulated from the semiconductor layer by the dielectric film. The second conductive paths cross the first conductive paths at points at which the first conductive paths pass through the semiconductor layer, so that only a single layer of metal interconnecting lines is needed.

20 Claims, 18 Drawing Sheets

SEMICONDUCTOR ARRAY DEVICE WITH SINGLE INTERCONNECTION LAYER

BACKGROUND OF THE INVENTION

1. Field of the Invention

The present invention relates to a matrix-driven semiconductor array device, more particularly to its wire-bonding pads and their interconnections to the array elements.

2. Description of the Related Art

Semiconductor array devices are useful in opto-electronic printing apparatus. A typical semiconductor array device is a densely spaced linear array of light-emitting diodes (LEDs) formed in a semiconductor chip referred to as an LED array. The LEDs in the array are generally driven by another type of semiconductor array device, referred to as a driver integrated circuit (IC). The LED array is connected to the driver IC by fine wires bonded to pads on the array chip and the driver IC chip.

Simple interconnection schemes in which each LED in the array has its own bonding pad become difficult to implement at high array densities. This has led to matrix driving schemes such as the one illustrated in FIG. 21, which shows part of an LED array 100 disclosed in Japanese Unexamined Patent Application Publication No. 13-77431. The LEDs 101 are separated into groups of eight by isolation trenches 102 that divide the surface of the LED array 100 into electrically isolated semiconductor blocks 103. Each semiconductor block 103 has a common electrode 104 formed near the row of LEDs 101. Eight common interconnecting lines 105 run parallel to the array, crossing the block boundaries. The common electrodes 104 and common interconnecting lines 105 are covered by an interlayer dielectric film 106.

Each LED 101 has an individual electrode 107 and an individual interconnecting line 108. Each semiconductor block 103 includes a pair of electrode pads 109, 110. The individual interconnecting lines 108 and electrode pads 109, 110 are formed on the interlayer dielectric film 106, each individual interconnecting line 108 making contact with one of the common interconnecting lines 105 through an opening 111 in the interlayer dielectric film 106. Electrode pad 110 is electrically coupled by an interconnecting lead 112 to the common electrode 104 in the same block. Electrode pad 109 is electrically coupled by an interconnecting lead 113 to one of the common interconnecting lines 105. The interconnecting leads 112, 113 are also formed on the interlayer dielectric film 106.

This matrix interconnection structure enables a large number of LEDs 101 to be driven from a relatively small number of electrode pads 109, 110. A problem is that at the points at which the individual interconnecting lines 108 and interconnecting leads 112, 113 cross the common electrodes 104 and common interconnecting lines 105, short circuits can occur due to defects in the interlayer dielectric film 106; such defects may arise from electrostatic breakdown or intrusion of foreign particles in the fabrication process. A further problem is that the interconnecting lines 108 and interconnecting leads 112, 113 may become electrically open at vertical steps in the surface of the interlayer dielectric film 106; the vertical steps are due to the thickness of the underlying common electrode pads 104 and common interconnecting lines 105.

High fabrication cost is also a problem since, because compared to a single-layer interconnection process, a multilayer interconnection process requires at least two additional photolithography steps to form the interlayer dielectric film and the upper layer of electrode pads and interconnecting lines.

SUMMARY OF THE INVENTION

An object of the present invention is to provide a matrix interconnection structure for a semiconductor array device having only a single layer of interconnecting lines.

The invented semiconductor array device has a semiconductor layer disposed on a current-blocking layer. The semiconductor layer is partially covered by a dielectric film, and is divided into a plurality of mutually isolated parts. A first interconnecting pad overlies and is electrically coupled to one of these parts. A second interconnecting pad is disposed on the dielectric film.

A first group of semiconductor circuit elements is disposed in one or more of the mutually isolated parts of the semiconductor layer. These semiconductor circuit elements have electrodes that are electrically coupled to the first interconnecting pad by first conductive paths passing through the semiconductor layer.

A second group of semiconductor circuit elements is disposed in one or more other mutually isolated parts of the semiconductor layer. These semiconductor circuit elements have electrodes that are electrically coupled to the second interconnecting pad by second conductive paths insulated from the semiconductor layer by the dielectric film.

At least one of the second conductive paths crosses at least one of the first conductive paths at a point at which the first conductive path passes through the semiconductor layer. Preferably, all crossings of the first and second conductive paths are made in this way. The first and second interconnecting pads can then be coupled to the first and second groups of semiconductor circuit elements by a single layer of interconnecting lines and leads.

The first and second groups of semiconductor circuit elements may be mutually interspersed to form a substantially linear array.

In one interconnection scheme, the second conductive paths include a shared interconnecting line extending parallel to the array, and interconnecting leads electrically connecting the shared interconnecting line to the electrodes of the second group of semiconductor circuit elements. The first conductive paths include individual electrodes positioned between these interconnecting leads, individual interconnecting lines connecting the individual electrodes to the electrodes of the first group of semiconductor circuit elements, and a shared electrode extending parallel to the shared interconnecting line, electrically coupled to the first interconnecting pad, and electrically coupled to the individual electrodes through the semiconductor layer beneath the shared interconnecting line.

In another interconnection scheme, the second conductive paths include a branched interconnecting line extending generally parallel to the substantially linear array, with branches leading to the electrodes of the second group of semiconductor circuit elements. The first conductive paths include one or more electrode pads disposed between respective pairs of branches of the branched interconnecting line, electrically coupled to the first interconnecting pad through the semiconductor layer, and interconnecting leads connecting these electrode pads to the electrodes of the second group of semiconductor circuit elements. The first interconnecting pad may be seated on one of the electrode pads.

The substantially linear array may be staggered, the first and second groups of semiconductor circuit elements being offset in mutually opposite directions. The two groups of semiconductor circuit elements may be separated by a trench. Each semiconductor circuit element may be disposed in a separate part of the semiconductor layer.

A plurality of third interconnecting pads may be disposed on the dielectric film on the opposite side of the array from the first and second interconnecting pads, each third interconnecting pad being electrically coupled to a mutually adjacent pair of the semiconductor circuit elements, one belonging to the first group, the other belonging to the second group.

The semiconductor layer may include a gallium arsenide (GaAs) contact layer, aluminum gallium arsenide (AlGaAs) cladding layers, and an AlGaAs active layer. The semiconductor circuit elements may be light-emitting elements.

The invention also provides an optical printing head including at least one semiconductor array device of the invented type, and an electrophotographic printer including at least one such optical printing head.

DETAILED DESCRIPTION OF THE INVENTION

Figure 1:
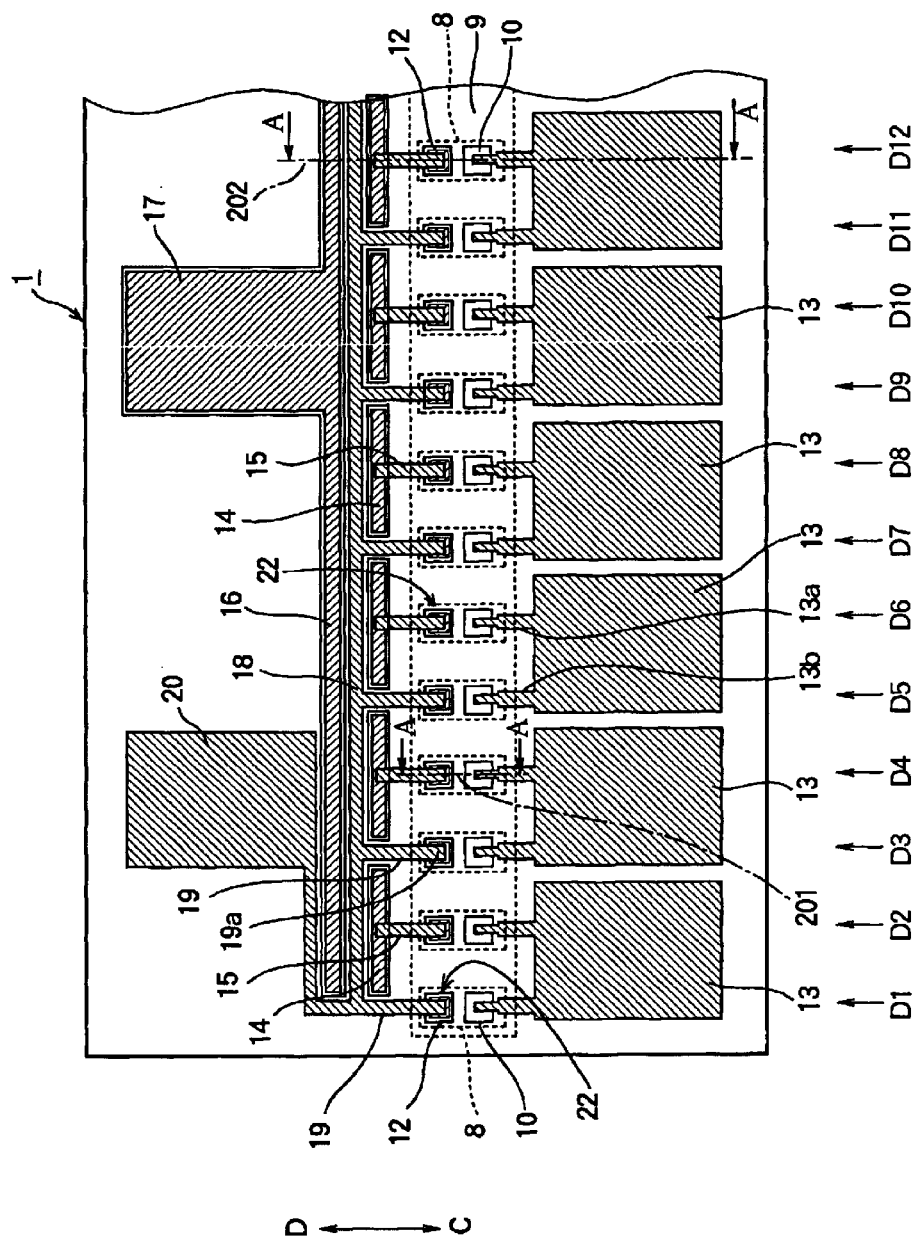
FIG. 1 is a plan view showing relevant parts of an LED array in a first embodiment of the present invention.

Embodiments of the invention will now be described with reference to the attached drawings, in which like elements are indicated by like reference characters.

First Embodiment

Figure 2:
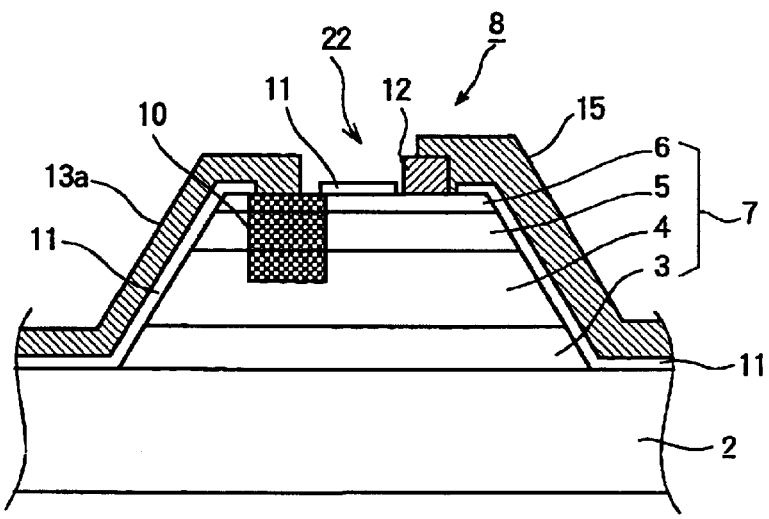
FIG. 2 is an enlarged sectional drawing of the LED array in FIG. 1.

FIG. 1 is a plan view showing relevant parts of the structure of an LED array 1 embodying the present invention. FIG. 2 shows the cross-section including index line 201 in FIG. 1, viewed from the direction of arrows A. The cross-section including index line 202 is illustrated in FIG. 7B, also viewed from the direction of arrows A.

Referring to FIG. 2, the LED array 1 has a high-resistance substrate 2 such as, for example, a GaAs semi-insulating substrate. An $Al_xGa_{1-x}As$ cladding layer 3, an $Al_yGa_{1-y}As$ active layer 4, an $Al_zGa_{1-z}As$ cladding layer 5, and a GaAs contact layer 6 are formed in this order on the substrate 2, creating an n-type semiconductor layer 7 comprising a plurality of constituent layers. The letters x, y, and z indicate aluminum (Al) composition ratios. The emission wavelength is determined by the value of y: if y is equal to 0.15, for example, the emission wavelength is seven hundred sixty nanometers (760 nm). High luminous efficiency can be obtained by setting x and z to values larger than y (x>y and z>y), creating a current confinement effect. An LED array of the homojunction type is obtained if x, y, and z are equal (x=y=z).

Although the n-type semiconductor layer 7 is formed on substantially the entire surface of the substrate 2, part of the n-type semiconductor layer 7 is divided into a plurality of island-shaped semiconductor blocks 8 disposed in a broad isolation trench 9 as shown in FIG. 1. The semiconductor blocks 8 are aligned in the longitudinal direction of the LED array 1.

A p-type diffusion region 10 is formed in each semiconductor block 8 by diffusion of a p-type impurity such as zinc (Zn) through an opening in a dielectric film 11 that covers the upper surface of the LED array 1. An n-electrode 12 is formed on each semiconductor block 8 in another opening in the dielectric film 11, making ohmic contact with the GaAs contact layer 6 (FIG. 2) in the n-type semiconductor layer 7.

A row of anode interconnecting pads 13 is formed on the dielectric film 11 on one side of the isolation trench 9 (the side indicated by arrow C in FIG. 1) parallel to the longitudinal direction of the array. Each anode interconnecting pad 13 has a pair of leads 13a, 13b, the tips of which function as p-electrodes by making ohmic contact with the p-type diffusion regions 10 in two adjacent semiconductor blocks 8.

A row of individual electrodes 14 is formed on the n-type semiconductor layer 7 in further openings in the dielectric film 11 on the other side of the isolation trench 9 (the side indicated by arrow D). The individual electrodes 14 are electrically coupled to the n-electrodes 12 of alternate semiconductor blocks 8 by individual interconnecting lines 15. The individual electrodes 14 are elongated in the longitudinal direction of the array, each extending for slightly less than twice the array pitch, and make ohmic contact with the GaAs contact layer 6 (FIG. 2) in the n-type semiconductor layer 7. The semiconductor blocks 8 to which the individual electrodes 14 are electrically connected by the individual interconnecting lines 15 constitute a first group in the array.

An elongated shared electrode 16 is formed parallel to the row of individual electrodes 14, extending over substantially the entire length of the array, spaced slightly away from the row of individual electrodes 14 in the direction of arrow D. The shared electrode 16 is joined to a first cathode interconnecting pad 17. Like the individual electrodes 14, the shared electrode 16 and cathode interconnecting pad 17 make ohmic contact through openings in the dielectric film 11 with the GaAs contact layer 6 (FIG. 2) in the n-type semiconductor layer 7. The contacts between the electrodes 14, 16 and the n-type semiconductor layer 7 can be seen in FIG. 7B.

A shared interconnecting line 18 extending in the longitudinal direction of the array is disposed on the dielectric film 11 between the individual electrodes 14 and the shared electrode 16. Interconnecting leads 19 extend from the shared interconnecting line 18 through the gaps between the individual electrodes 14. The tips 19a of the interconnecting leads 19 are electrically coupled to the n-electrodes 12 in a second group of semiconductor blocks 8 located at alternate positions in the array, comprising the semiconductor blocks 8 not connected to the individual interconnecting lines 15. One of the interconnecting leads 19, disposed at an end of the array, also joins the shared interconnecting line 18 to a second cathode interconnecting pad 20, which is disposed on the side of the shared electrode 16 indicated by arrow D.

The anode interconnecting pads 13 are connected by their first leads 13a to p-type semiconductor diffusion regions 10 in the first group of semiconductor blocks 8, and by their second leads 13b to p-type semiconductor diffusion regions 10 in the second group of semiconductor blocks 8. The pn junction formed between each p-type semiconductor diffusion region 10 and the n-type semiconductor layer 7 functions as a light-emitting element 22. Each light-emitting element 22 is a semiconductor circuit element.

Next, a method of fabricating the LED array 1 will be described with reference to the plan views in FIGS. 3A to 7A and the corresponding sectional views in 3B to 7B, which show the sections including index line 203 in FIGS. 3A to 7A viewed from the direction of the arrows marked A.

Figure 3A:
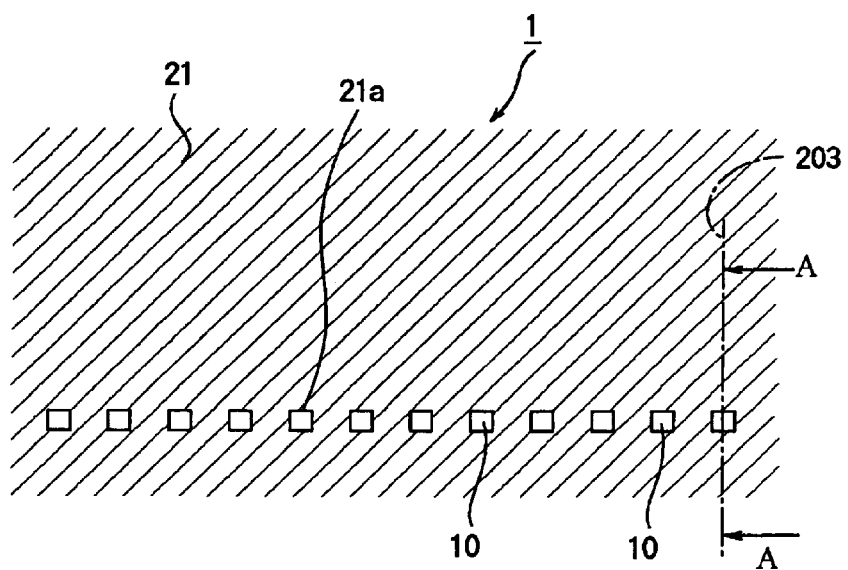
FIGS. 3A, 4A, 5A, 6A, and 7A are plan views illustrating steps in the fabrication of the LED array in FIG. 1.
Figure 3B:
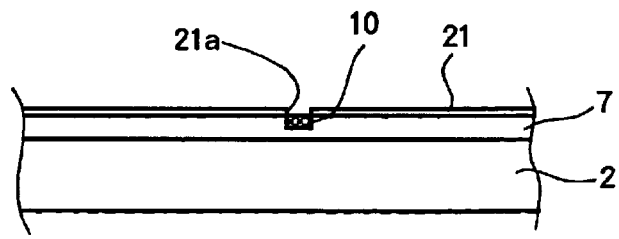
FIGS. 3B, 4B, 5B, 6B, and 7B are sectional views illustrating the same fabrication steps.

FIGS. 3A and 3B illustrate the stage at which the row of p-type semiconductor diffusion regions 10 has been formed. First, the fabrication process up to this stage will be described briefly.

Referring to FIG. 3B, an n-type semiconductor layer 7 comprising, from the bottom up, an $Al_xGa_{1-x}As$ cladding layer 3, an $Al_yGa_{1-y}As$ active layer 4, an $Al_zGa_{1-z}As$ cladding layer 5, and a GaAs contact layer 6 is grown epitaxially on a semi-insulating GaAs substrate 2, or another type of high-resistance substrate. The GaAs contact layer 6 is grown for the purpose of making good electrical contact with the various electrodes that will be formed later.

A diffusion mask 21 with openings 21a at the desired locations of the light-emitting elements is formed as a film on the substrate. Zinc is diffused through these openings by, for example, a solid phase diffusion process to form the p-type semiconductor diffusion regions 10, which extend into the active layer 4 in the n-type semiconductor layer 7.

Figure 4A:
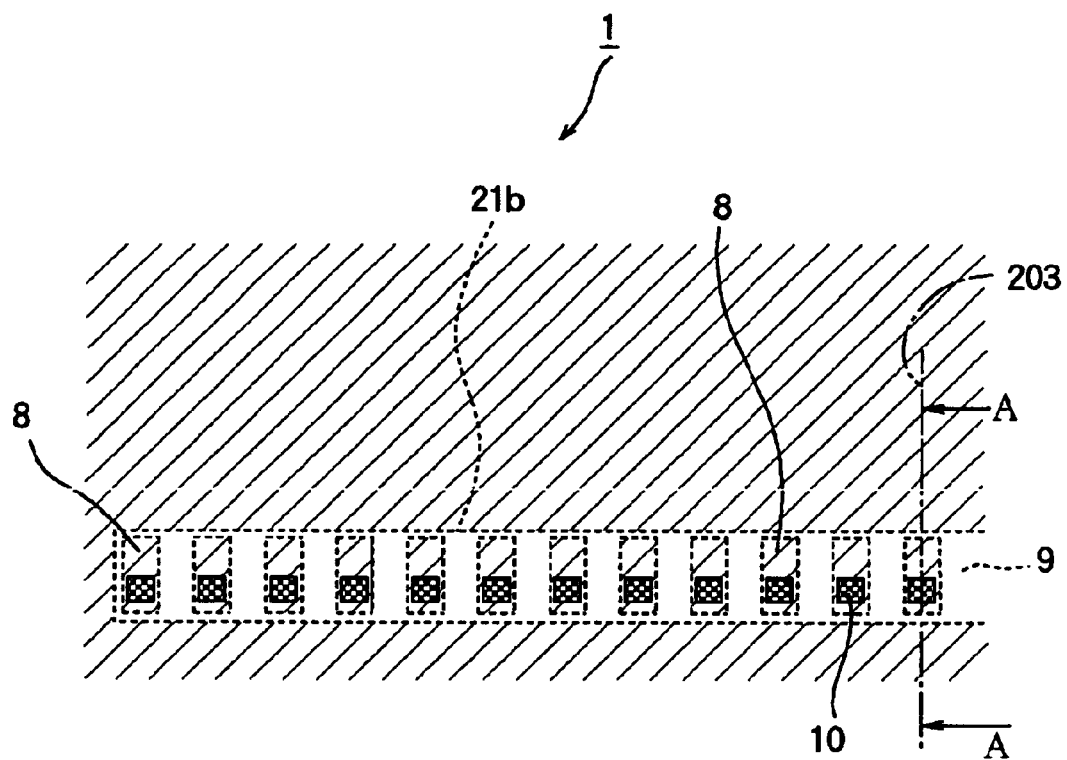
Figure 4B:
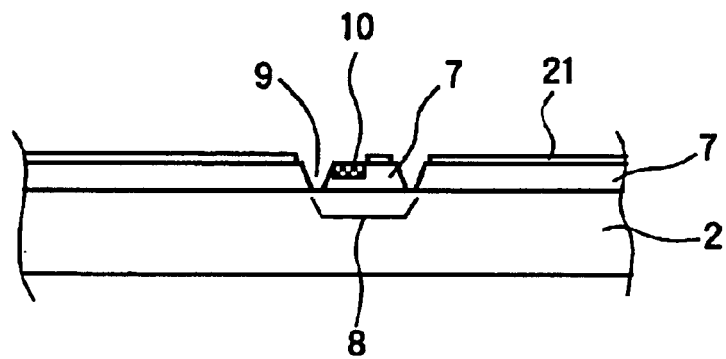

Next, to form the isolation trench 9 and island-shaped semiconductor blocks 8, the openings 21a in FIG. 3A are covered and another opening 21b is created in the diffusion mask 21 as shown in FIG. 4A. An etchant including, for example, phosphoric acid and hydrogen peroxide is used to etch the exposed part of the n-type semiconductor layer 7 down to the high-resistance substrate 2 as shown in FIG. 4B.

Figure 5A:
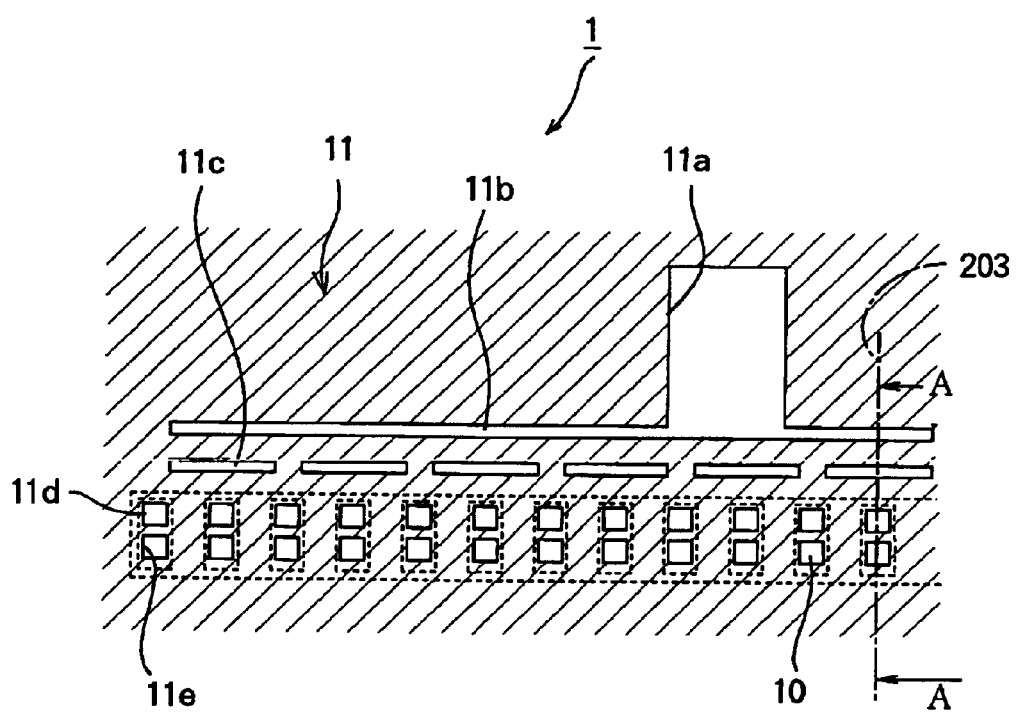
Figure 5B:
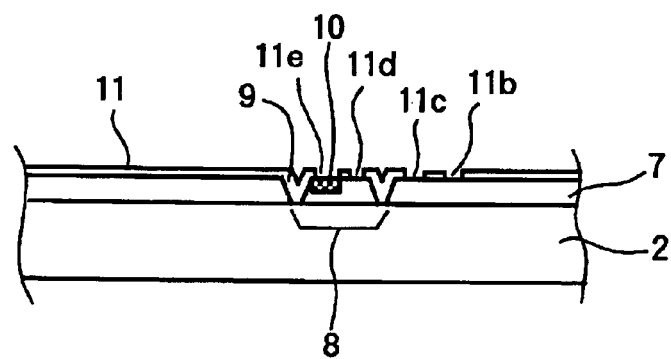

Next, as shown in FIGS. 5A and 5B, a dielectric film 11 of aluminum oxide ($Al_2O_3$), aluminum nitride (AlN), silicon nitride ($Si_3N_4$), or the like is formed on the entire major surface of the array except for an area 11a in which the first cathode interconnecting pad 17 will be formed, an area 11b in which the shared electrode 16 will be formed, areas 11c in which the individual electrodes 14 will be formed, areas 11d in which the n-electrodes 12 will be formed, and areas 11e in which the p-type semiconductor diffusion regions 10 have been formed. For simplicity, the dielectric film 11 is shown as including the remaining parts of the diffusion mask 21. The dielectric film 11 is first formed on the entire major surface of the array, then stripped off from areas 11a–11e by photolithography and etching.

Figure 6A:
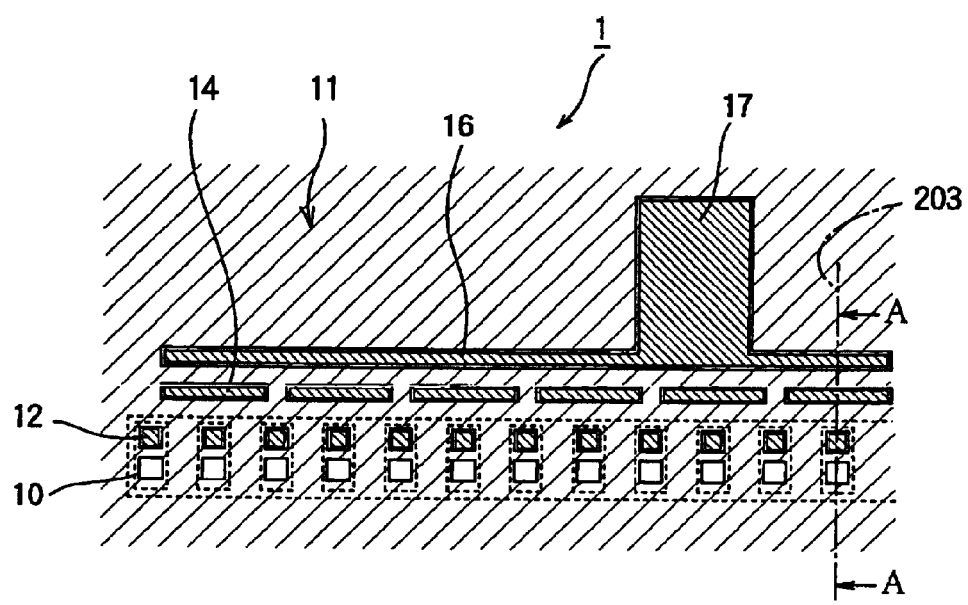
Figure 6B:
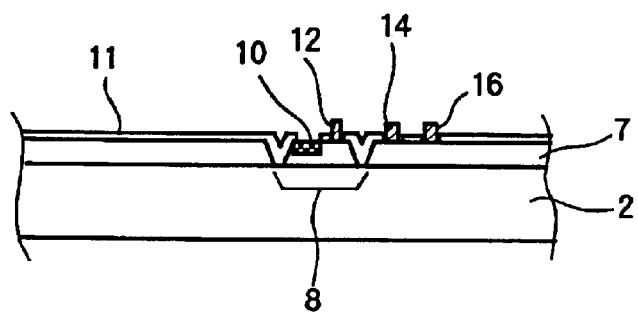

Next, as shown in FIGS. 6A and 6B, the n-electrodes 12, individual electrodes 14, shared electrode 16, and first cathode interconnecting pad 17 are formed simultaneously, each making contact with the GaAs contact layer 6 (FIG. 2) at the top of the n-type semiconductor layer 7. There is no particular restriction on the electrode material, provided it can make ohmic contact with an n-type GaAs layer; for example, a gold-germanium/nickel/gold (AuGe/Ni/Au) multi-layer may be used.

Figure 7A:
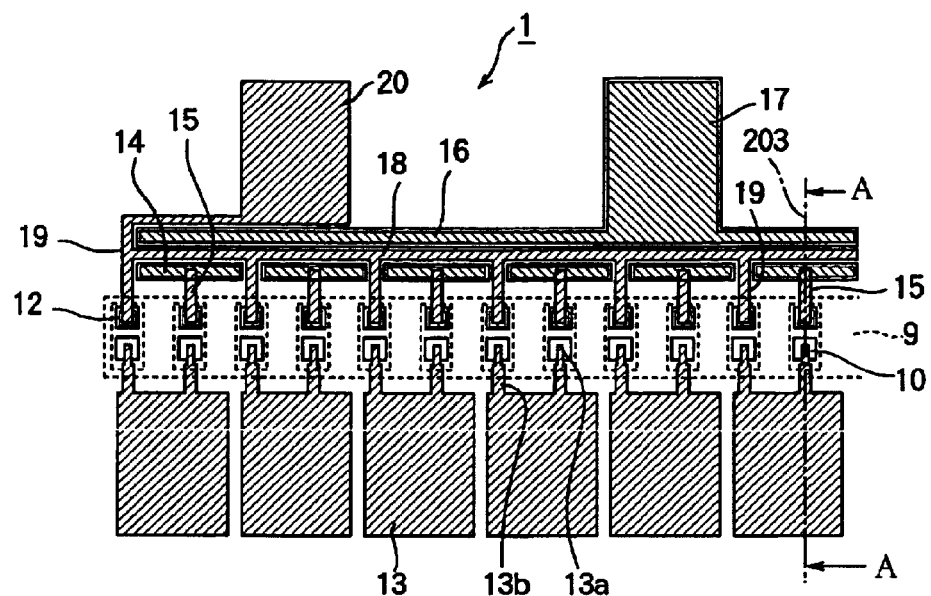
Figure 7B:
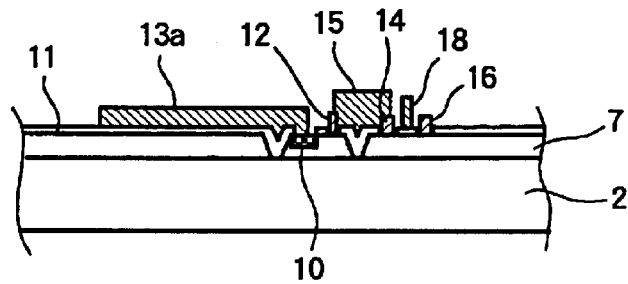

Finally, the anode interconnecting pads 13 and their leads 13a, 13b, the individual interconnecting lines 15, the interconnecting leads 19, the shared interconnecting line 18, and the second cathode interconnecting pad 20 are formed on the dielectric film 11 in another single step as shown in FIGS. 7A and 7B, the tips of the anode interconnecting pad leads 13a, 13b making contact with the p-type diffusion regions 10 of the semiconductor blocks 8. There is no particular restriction on the material from which these pads, leads, and lines are formed, provided it can make ohmic contact with a p-type GaAs layer; a titanium/platinum/gold (Ti/Pt/Au) multi-layer may be used, for example.

The main features of the interconnection structure shown in FIG. 1 are as follows:

(1) The shared interconnecting line 18, which is electrically connected to the second cathode interconnecting pad 20, extends over substantially the whole length of the array.

(2) This shared interconnecting line 18 is disposed between the individual electrodes 14 and the shared electrode 16. The shared electrode 16, which is electrically connected to the first cathode interconnecting pad 17, parallels the shared interconnecting line 18 for substantially its entire length, but there are gaps between the individual electrodes 14, through which the interconnecting leads 19 extend in the direction of arrow D from the shared interconnecting line 18.

In this structure, each n-electrode 12 in the first group of semiconductor blocks 8 is electrically coupled to the first cathode interconnecting pad 17 by a conductive path comprising an individual interconnecting line 15, an individual electrode 14, the n-type semiconductor layer 7, and the shared electrode 16. Although the electrical conductivity of the n-type semiconductor layer 7 is lower than the electrical conductivity of the metal materials forming the other parts of the path, since the part of the electrical path disposed within the n-type semiconductor layer 7 is short and wide, its electrical resistance is correspondingly low.

The n-electrodes 12 in the second group of semiconductor blocks 8 are electrically coupled to the second cathode interconnecting pad 20 by the shared interconnecting line 18 and its interconnecting leads 19.

A method of driving the LED array 1 will be described with reference to the plan view in FIG. 1. To facilitate the description, numbers D1, D2, D3, D4, . . . are assigned to the light-emitting elements 22 in sequence from the left. The first group of light-emitting elements have even numbers; the second group of light-emitting elements have odd numbers.

Desired light-emitting elements 22 in the first group are driven by placing the corresponding anode interconnecting pads 13 at a relatively high potential and the first cathode interconnecting pad 17 at a relatively low potential, thereby supplying forward current from the anode side to the cathode side. The anode interconnecting pads 13 corresponding to non-driven light-emitting elements in the first group may be left electrically open or may be driven to the relatively low potential. The second cathode interconnecting pad 20 may be left electrically open or may be driven to the relatively high potential. The non-driven light-emitting elements 22 in the first group and the light-emitting elements 22 in the second group are therefore left unbiased or reverse-biased, and do not emit light.

Similarly, desired light-emitting elements 22 in the second group are driven by placing their anode interconnecting pads 13 at a relatively high potential and the second cathode interconnecting pad 20 at a relatively low potential, thereby supplying forward current. The other anode interconnecting pads 13 and the first cathode interconnecting pad 17 are left electrically open, or are driven to potentials such that the non-driven light-emitting elements 22 in the second group and the light-emitting elements 22 in the first group are left unbiased or reverse-biased.

To drive light-emitting element D10, for example, its anode interconnecting pad 13 is placed at a higher potential than the first cathode interconnecting pad 17. Adjacent light-emitting element D9 does not turn on because the second cathode interconnecting pad 20 is also placed at the higher potential, or is left open. Similarly, to drive light-emitting element D5, its anode interconnecting pad 13 is placed at a higher potential than the second cathode interconnecting pad 20. Adjacent light-emitting element D6 does not turn on because the first cathode interconnecting pad 17 is also placed at the higher potential, or left open.

This matrix driving scheme enables 2n light-emitting elements to be driven by two cathode interconnecting pads and n anode interconnecting pads. Differing from conventional matrix driving schemes, there is no risk of short circuits between interconnecting lines or leads, because the interconnecting lines and leads do not cross one another. Since all interconnecting lines and leads are formed in a single layer, the fabrication process is also simpler than in conventional matrix driving schemes, and the cost of the LED array is correspondingly lower.

In a variation of the first embodiment, the high-resistance substrate 2 used as a current-blocking layer below the n-type semiconductor layer 7 is replaced by a semiconductor substrate of the opposite conductive type (p-type), which can also function as a current-blocking layer. Alternatively, instead of having the substrate function as a current-blocking layer, a separate current-blocking layer (either a high-resistance layer or a layer of the opposite conductive type) may be formed between the semiconductor layer 7 and the substrate, in which case the conductive type and resistivity of the substrate are immaterial.

Second Embodiment

Figure 8:
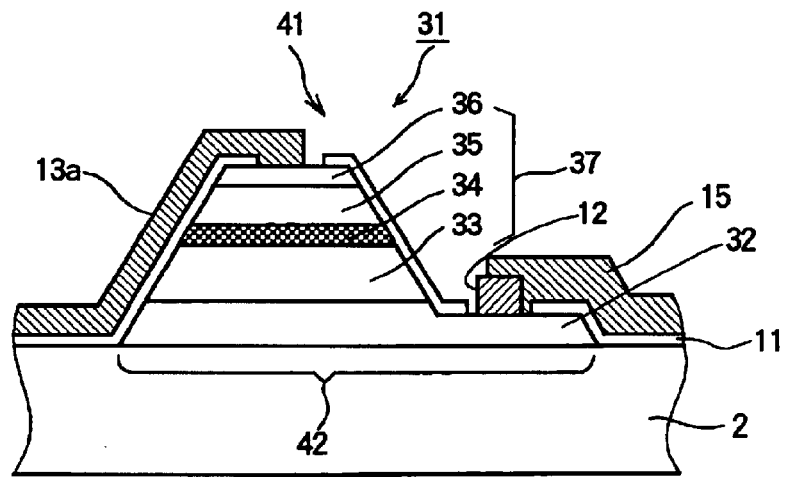
FIG. 8 is a sectional view of relevant parts of an LED array in a second embodiment of the invention.

A second embodiment of the invention will be described with reference to FIG. 8, FIGS. 9A to 13A, and FIGS. 9B to 13B. FIG. 13A shows a plan view of the completed LED array 31. FIG. 8 shows an enlarged cross-sectional view through index line 211 in FIG. 13A, viewed from the direction of the arrows A.

Referring to FIG. 8, the LED array 31 has a high-resistance substrate 2 such as a GaAs semi-insulating substrate on which are formed, in sequence from the bottom up, an n-type GaAs contact layer 32, an n-type $Al_xGa_{1-x}As$ cladding layer 33, an $Al_yGa_{1-y}As$ active layer 34, a p-type $Al_zGa_{1-z}As$ cladding layer 35, and a p-type GaAs contact layer 36. The Al composition ratios x, y, and z may have the same values as in the first embodiment, (e.g., x, z≧y=0.15). If the inequality is strict (x>y and z>y), the n-type $Al_xGa_{1-x}As$ cladding layer 33, $Al_yGa_{1-y}As$ active layer 34, and p-type $Al_zGa_{1-z}As$ cladding layer 35 form a double heterojunction structure. These layers 33, 34, 35 and the p-type GaAs contact layer 36 constitute a semiconductor multilayer 37. The semiconductor multilayer 37 and n-type GaAs contact layer 32 constitute a semiconductor layer. Light is emitted from the $Al_yGa_{1-y}As$ active layer 34, where electrons injected from the n-type $Al_xGa_{1-x}As$ cladding layer 33 recombine with holes injected from the p-type $Al_zGa_{1-z}As$ cladding layer 35.

Next, a method of fabricating the LED array 31 will be described with reference to the plan views in FIGS. 9A to 13A and the corresponding sectional views in 9B to 13B, which show the sections including index line 213 in FIGS. 9A to 13A viewed from the direction of the arrows marked A.

Figure 9A:
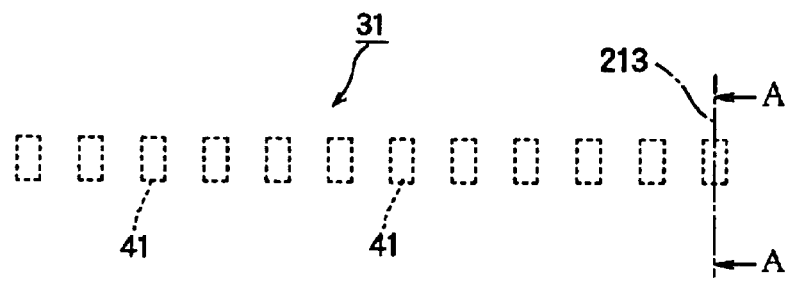
FIGS. 9A, 10A, 11A, 12A, and 13A are plan views illustrating steps in the fabrication of the LED array in FIG. 8.
Figure 9B:
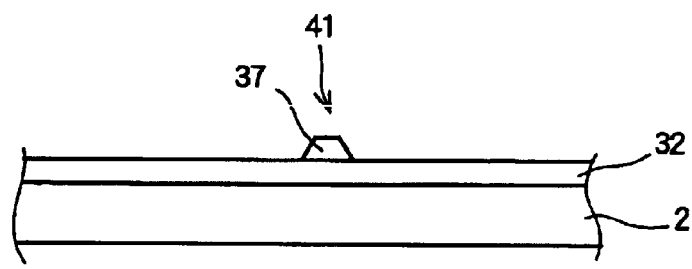
FIGS. 9B, 10B, 11B, 12B, and 13B are sectional views illustrating the same fabrication steps.

Referring to FIGS. 9A and 9B, after the n-type GaAs contact layer 32 and semiconductor multilayer 37 have been grown on the entire major surface of the high-resistance substrate 2, the row of light-emitting elements 41 is formed by selectively etching the semiconductor multilayer 37 down to the n-type GaAs contact layer 32. The semiconductor multilayer 37 is completely removed, except for the parts forming the light-emitting elements 41.

Figure 10A:
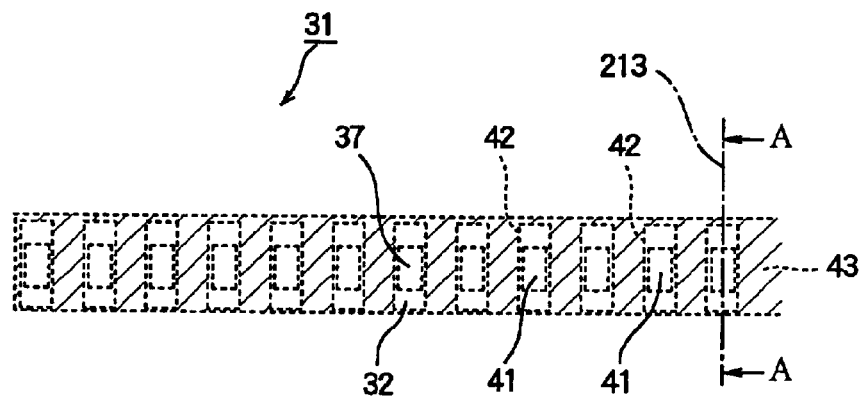
Figure 10B:
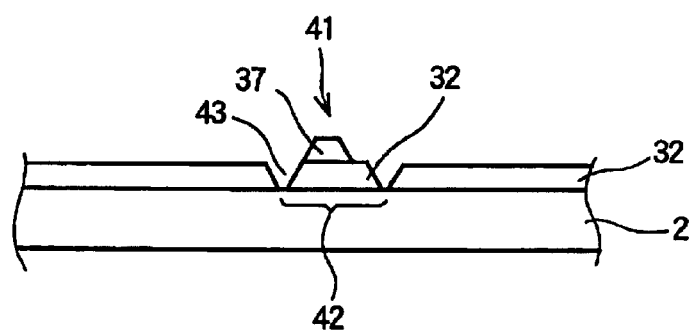

Next, referring to FIGS. 10A and 10B, the n-type GaAs contact layer 32 is selectively etched to form an isolation trench 43 surrounding a linear array of electrically isolated, island-shaped semiconductor blocks 42, each including a light-emitting element 41. In each semiconductor block 42, the remaining part of the n-type GaAs contact layer 32 is slightly wider than the semiconductor multilayer 37 above it.

The subsequent fabrication steps, illustrated in FIGS. 11A to 13A and 11B to 13B, are similar to the steps in the first embodiment illustrated in FIGS. 5A to 7A and 5B to 7B, with the following differences: (1) in regions other than the semiconductor blocks 42 and isolation trench 43, the dielectric film 11 is formed on the n-type GaAs contact layer 32; (2) in the semiconductor blocks 42, the n-electrodes 12 are formed on the n-type GaAs contact layer 32; and (3) the tips of the leads 13a, 13b of the anode interconnecting pads 13 make contact with the p-type GaAs contact layer 36 instead of with a p-type diffusion region in an n-type layer.

Figure 11A:
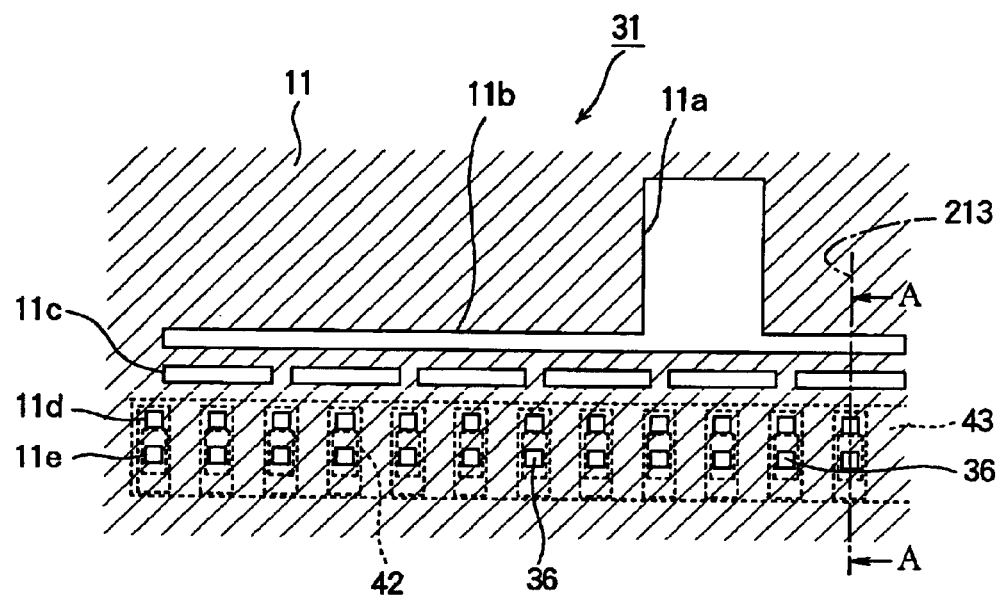
Figure 11B:
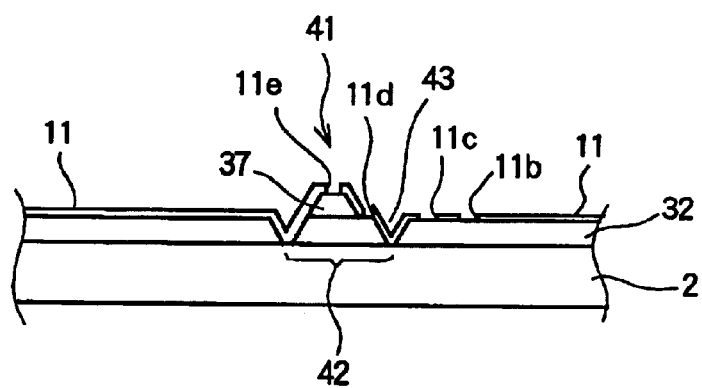

Referring to FIGS. 11A and 11B, the dielectric film 11 is formed on the entire major surface of the LED array 31 except for an area 11a in which the first cathode interconnecting pad 17 will be formed, an area 11b in which the shared electrode 16 will be formed, areas 11c in which the individual electrodes 14 will be formed, areas 11d in which the n-electrodes 12 will be formed, and areas 11e in which the p-type GaAs contact layer 36 is exposed at the top of each light-emitting element 41. The dielectric film 11 is first formed on the entire major surface of the array, then stripped off from areas 11a–11e by photolithography and etching.

Figure 12A:
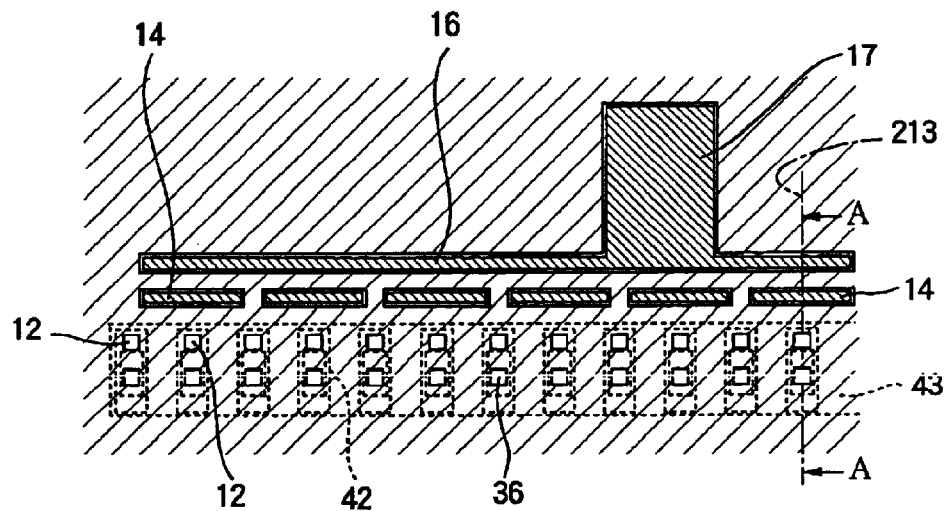
Figure 12B:
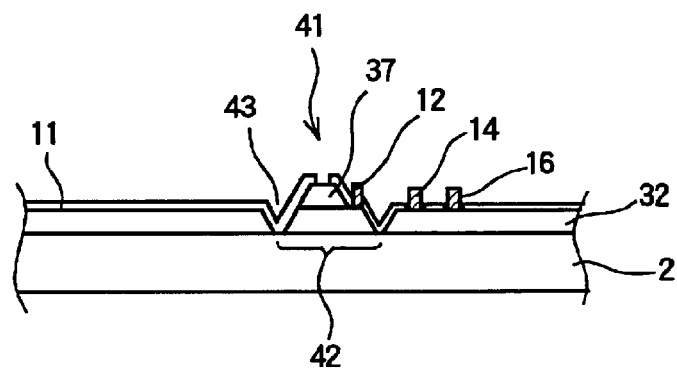
Figure 13A:
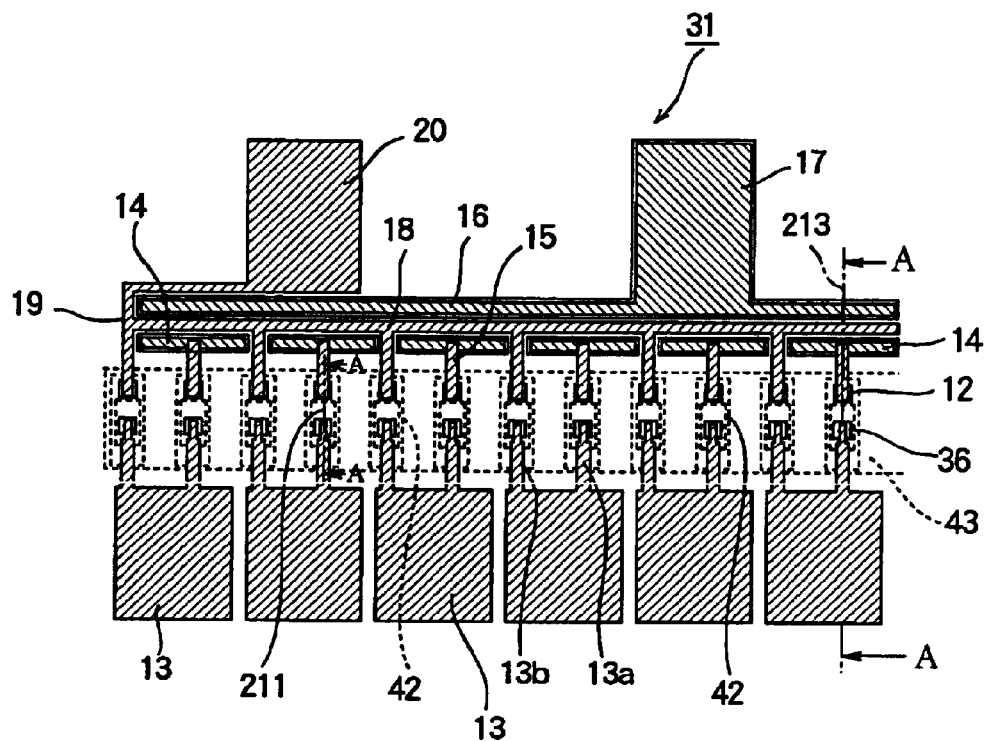

Next, as shown in FIGS. 12A and 12B, the n-electrodes 12, individual electrodes 14, shared electrode 16, and first cathode interconnecting pad 17 are formed in a single process step, each making ohmic contact with the n-type GaAs contact layer 32.

Figure 13B:
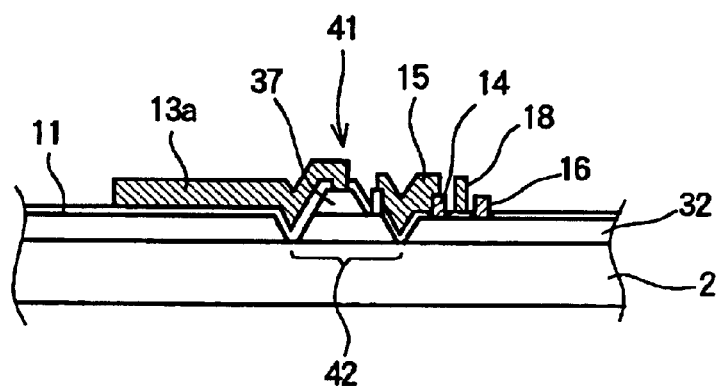

Finally, the anode interconnecting pads 13, their leads 13a, 13b, the individual interconnecting lines 15, the shared interconnecting line 18, its interconnecting leads 19, and the second cathode interconnecting pad 20 are formed simultaneously on the dielectric film 11 as shown in FIGS. 13A and 13B. The tips of the leads 13a, 13b of the anode interconnecting pads 13 make ohmic contact with the p-type GaAs contact layer 36.

In this structure, the electrical paths from the n-electrodes 12 in the first group of semiconductor blocks 42 to the first cathode interconnecting pad 17 pass through the individual interconnecting lines 15 to the individual electrodes 14, then through the n-type GaAs contact layer 32 to the shared electrode 16, which is continuous with the first cathode interconnecting pad 17.

The LED array 31 in the second embodiment can be driven by the same method as in the first embodiment, so a description will be omitted.

The LED array 31 in the second embodiment has the same general structure as in the first embodiment and provides the same general effects, but is easier to fabricate, because creating p-type and n-type layers in the semiconductor multilayer 7 by epitaxial growth is a simpler and more reproducible process than creating pn junctions by impurity diffusion. Compared with the LED array in the first embodiment, the LED array 31 in the second embodiment has better uniformity, and its manufacturing cost is reduced.

Third Embodiment

Figure 14:
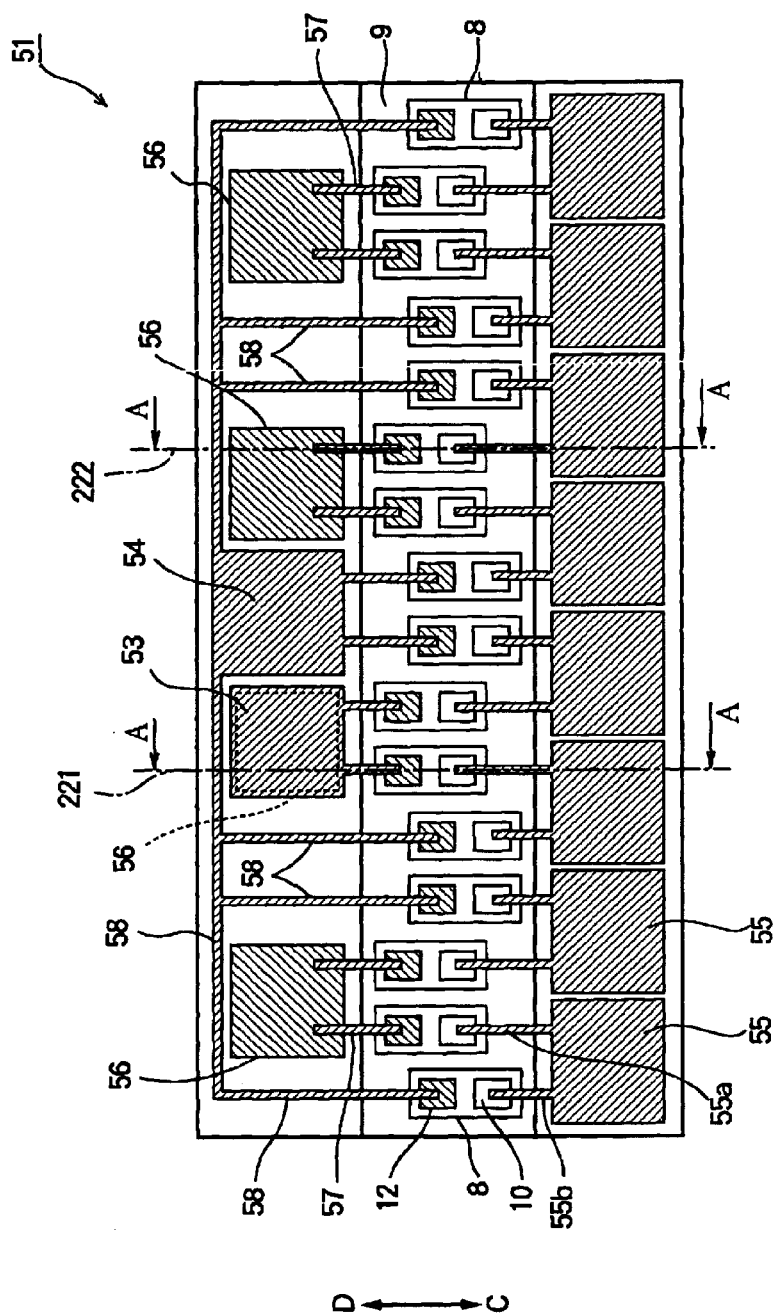
FIG. 14 is a plan view showing relevant parts of an LED array in a third embodiment of the invention.
Figure 15A:
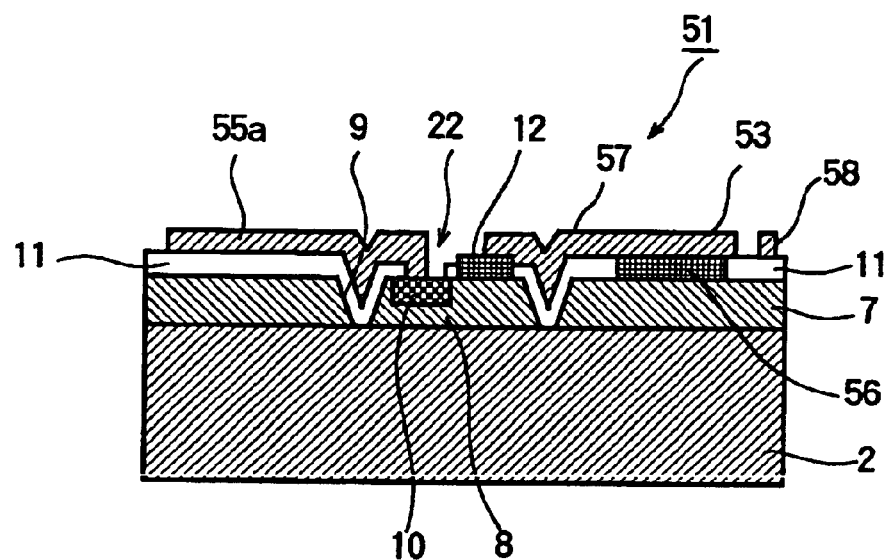
FIGS. 15A and 15B are sectional views of the LED array in FIG. 14.
Figure 15B:
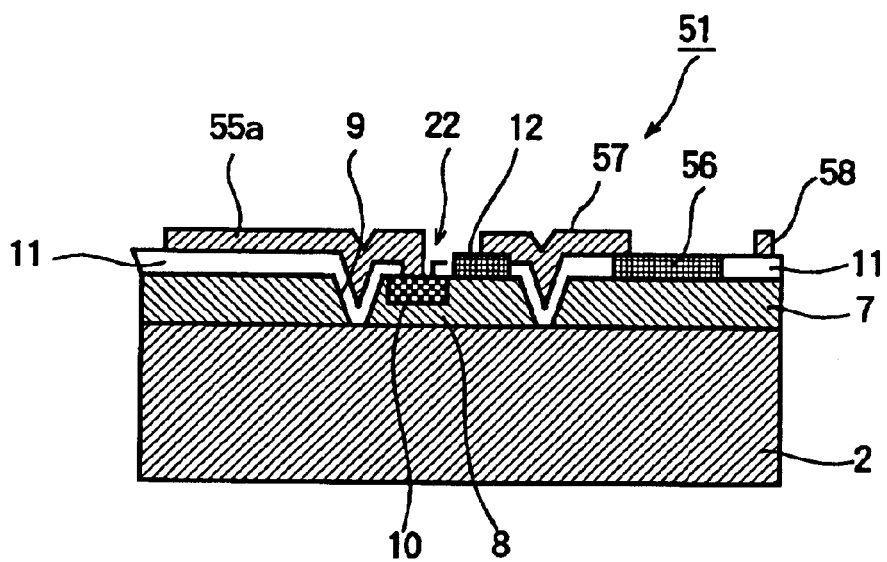

A third embodiment will be described with reference to the plan view in FIG. 14 and the sectional views in FIGS. 15A and 15B, which show cross sections through index lines 221 and 222, respectively, viewed from the direction of the arrows marked A. The third embodiment differs from the first embodiment in that the light-emitting elements are disposed in a staggered array and are differently grouped. The configuration of the individual electrodes is also altered. The following description will focus on these differences.

As in the first embodiment, the LED array 51 in the third embodiment has a plurality of semiconductor blocks 8 isolated from one another by an isolation trench 9, each semiconductor block 8 including a p-type semiconductor diffusion region 10 and an n-electrode 12. The semiconductor block 8 at one end of the array (the left end in the drawing) is offset in the direction of arrow C, the next two semiconductor blocks are offset in the direction of arrow D, the next two semiconductor blocks are offset in the direction of arrow C, and so on, alternate pairs of semiconductor blocks 8 being offset in mutually opposite directions to form a staggered array.

A first cathode interconnecting pad 53 and a second cathode interconnecting pad 54 are disposed adjacent to this staggered array on one side (the side indicated by arrow D). A row of anode interconnecting pads 55 is disposed on the other side (the side indicated by arrow C). Each anode interconnecting pad 55 has a pair of leads 55a, 55b that make ohmic contact with the p-type semiconductor diffusion regions 10 in a pair of mutually adjacent semiconductor blocks 8 offset in different directions.

A plurality of cathode electrodes 56 are disposed on the same side of the array as the cathode interconnecting pads 53, 54, facing the pairs of semiconductor blocks 8 offset in the direction of arrow D. As shown in FIGS. 15A and 15B, the cathode electrodes 56 make ohmic contact with the n-type semiconductor layer 7 through openings in the dielectric film 11. Each cathode electrode 56 is electrically coupled by a pair of interconnecting lines 57 to the n-electrodes 12 in the facing pair of semiconductor blocks 8. One of the cathode electrodes 56 underlies the first cathode interconnecting pad 53, which is continuous with the corresponding pair of interconnecting lines 57, as shown in FIG. 15A. The second cathode interconnecting pad 54 is electrically coupled by a branched interconnecting line 58 to the n-electrodes 12 of the semiconductor blocks 8 offset in the direction of arrow C.

In the third embodiment, the semiconductor blocks 8 offset in the direction of arrow D constitute the first group, and the semiconductor blocks 8 offset in the direction of arrow C constitute the second group. The cathode electrodes 56 correspond to the individual electrodes in the first embodiment. The branched interconnecting line 58 corresponds to the shared interconnecting line 18 and interconnecting leads 19 in the first embodiment.

The cathode electrodes 56 are electrically interconnected through the n-type semiconductor layer 7 (e.g., through the GaAs contact layer 6 in FIG. 2). The first cathode interconnecting pad 53 is therefore electrically coupled through the n-type semiconductor layer 7, cathode electrodes 56, and interconnecting lines 57 to the n-electrodes 12 in the first group of semiconductor blocks 8. To establish a good electrical interconnection, the n-type semiconductor layer 7 preferably includes a semiconductor impurity element such as sulfur (S), selenium (Se), tellurium (Te), germanium (Ge), or silicon (Si) with a concentration of about $10^{15}$ to $10^{19}$ atoms per cubic centimeter ($10^{15}/cm^3$ to $10^{19}/cm^3$).

Next, a fabrication method for this LED array 51 will be described.

Figure 16A:
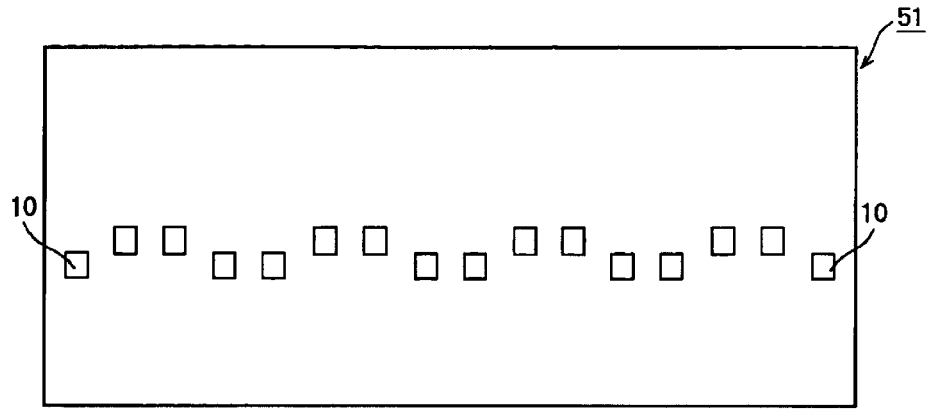
FIGS. 16A, 16B, 16C, 17A, and 17B are plan views illustrating steps in the fabrication of the LED array in FIG. 14.

The LED array 51 is formed on the type of substrate described in the first embodiment, comprising an n-type semiconductor layer 7 grown epitaxially on a high-resistance 2 such as a semi-insulating GaAs substrate. The n-type semiconductor layer 7 may include an $Al_xGa_{1-x}As$ cladding layer 3, an $Al_yGa_{1-y}As$ active layer 4, an $Al_zGa_{1-z}As$ cladding layer 5, and a GaAs contact layer 6 as shown in FIG. 2. The p-type semiconductor diffusion regions 10 are formed by the same method as in the first embodiment, but at the staggered locations indicated in FIG. 16A.

Figure 16B:
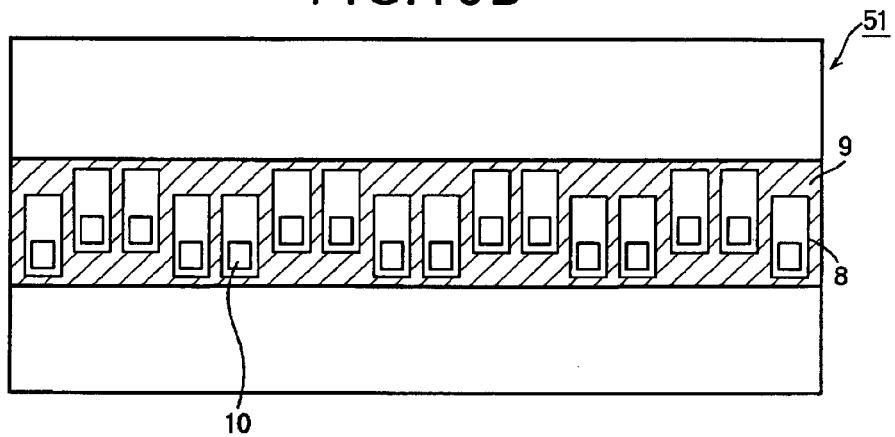

Next, as shown in FIG. 16B, the isolation trench 9 is formed by wet etching down to the high-resistance substrate 2 as described in the first embodiment, using, for example, an etchant including phosphoric acid and hydrogen peroxide.

Figure 16C:
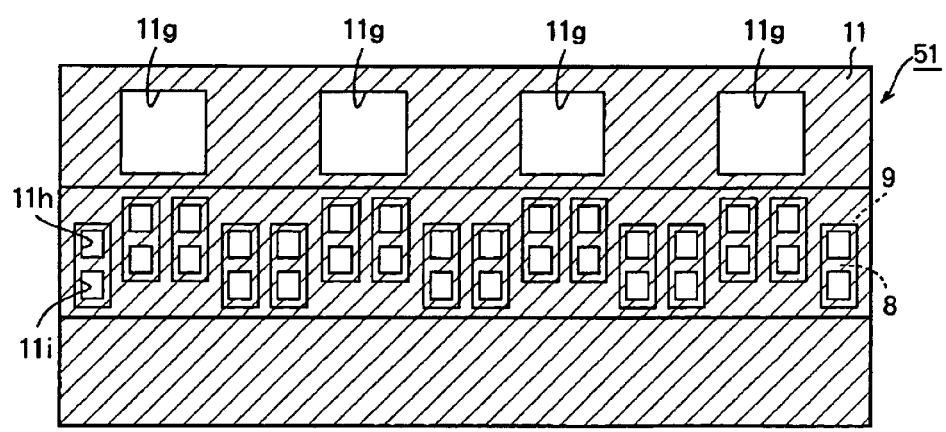

Next, as shown in FIG. 16C, the dielectric film 11 is formed on the entire major surface of the LED array 51 except for areas 11g where the cathode electrodes 56 will be formed, areas 11h where the n-electrodes 12 will be formed, and areas 11i where the p-type semiconductor diffusion regions 10 have been formed.

Figure 17A:
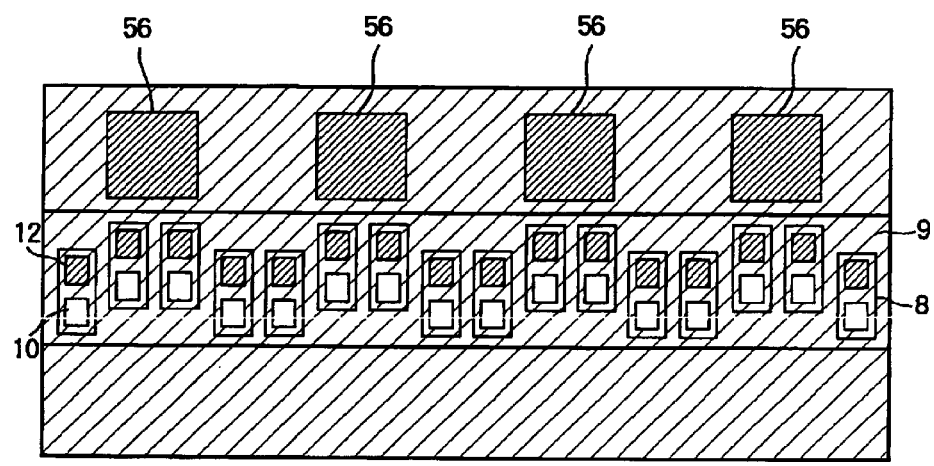

Next, as shown in FIG. 17A, the n-electrodes 12 and cathode electrodes 56 are formed in a single process step, each making ohmic contact with the GaAs contact layer 6 (FIG. 2) at the top of the n-type semiconductor layer 7. There is no particular restriction on the electrode material, provided it can make ohmic contact with an n-type GaAs layer; for example, an AuGe/Ni/Au multi-layer or the like may be used.

Figure 17B:
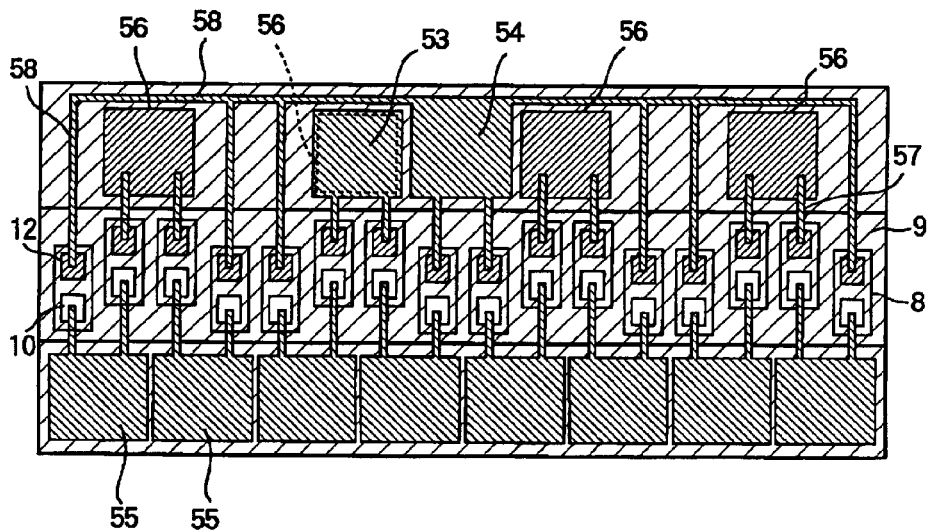

Finally, as shown in FIG. 17B, the anode interconnecting pads 55, their leads 55a, 55b, the interconnecting lines 57, the second cathode interconnecting pad 54, and the branched interconnecting line 58 are formed simultaneously on the dielectric film 11, while the first cathode interconnecting pad 53 is formed on one of the cathode electrodes 56. The tips of the leads 55a, 55b of the anode interconnecting pads 55 form ohmic contacts with the p-type diffusion region 10 of the corresponding semiconductor blocks 8. There is no particular restriction on the material used to form these pads, leads, and lines, provided it can make ohmic contact with a p-type GaAs layer; for example, a Ti/Pt/Au multi-layer may be used.

A method of driving the LED array 51 will be described with reference to FIG. 14.

First, to drive desired light-emitting elements offset in the direction of arrow C, a forward bias is applied between the corresponding anode interconnecting pads 55 and the second cathode interconnecting pad 54. The first cathode interconnecting pad 53 may be left electrically open or biased to a positive potential, so that the light-emitting elements offset in the direction of arrow D are unbiased or reverse-biased, and do not emit light. Next, to drive desired light-emitting elements offset in the direction of arrow D, a forward bias is applied between the corresponding anode interconnecting pads 55 and the first cathode interconnecting pad 53, leaving the second cathode interconnecting pad 54 electrically open or positively biased so that the light-emitting elements on the side of arrow C remain unbiased or reverse-biased and do not emit light.

The groups of light-emitting elements offset in the C and D directions can thus be driven alternately in a time-division driving scheme. The time interval between the driving of the two groups of light-emitting elements can be adjusted according to the rotational speed of a photosensitive drum in an electrophotographic printer, so that the two groups of light-emitting elements illuminate a single line of dots on the surface of the photosensitive drum as the photosensitive drum turns at a constant speed.

Other effects of the third embodiment are the same as in the first embodiment.

Fourth Embodiment

The fourth embodiment differs from the first embodiment mainly in that the isolation trench has a meandering shape. The following description will focus on this difference.

Figure 18:
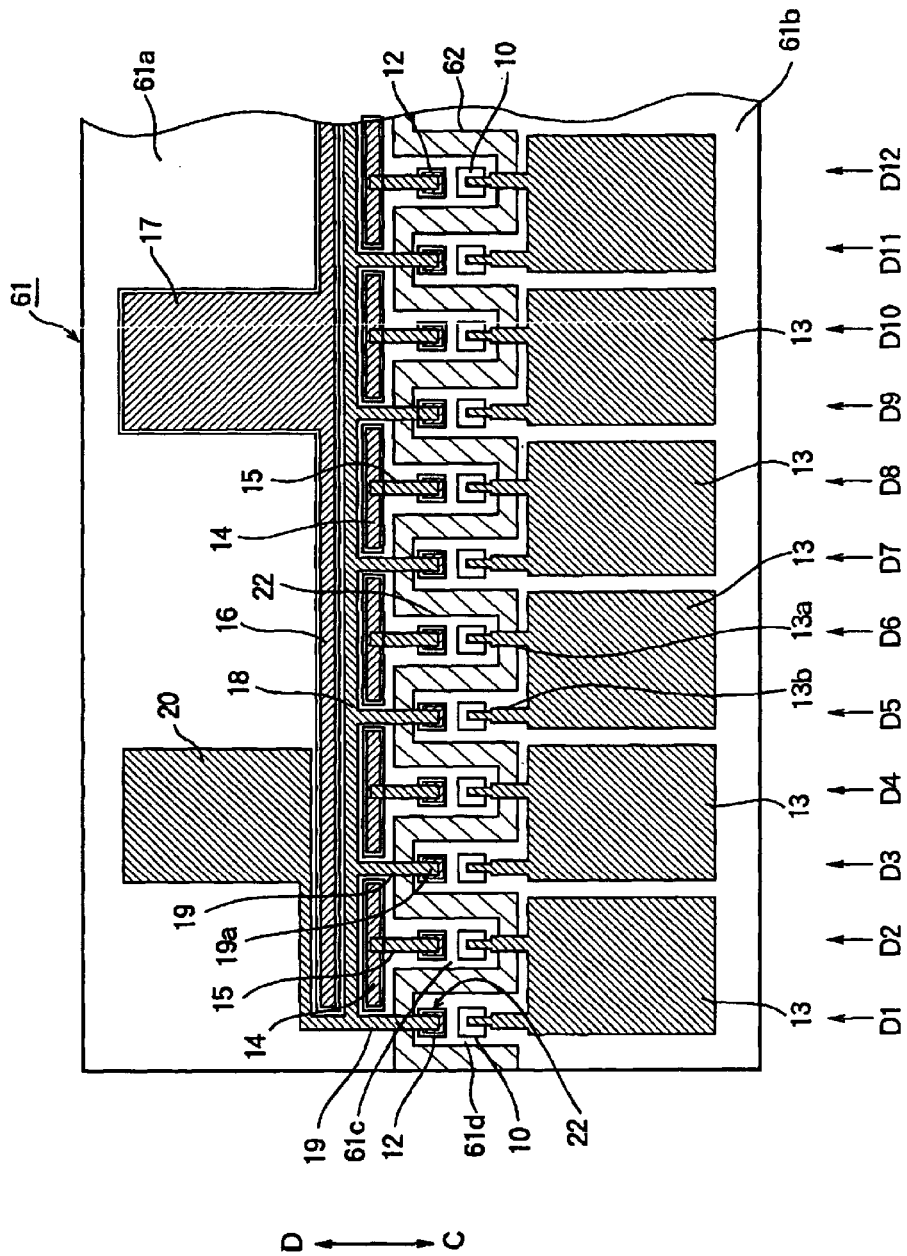
FIG. 18 is a plan view showing relevant parts of an LED array in a fourth embodiment of the invention.

Referring to FIG. 18, the n-type semiconductor layer in the LED array 61 in the fourth embodiment is divided into two semiconductor blocks 61a, 61b by the isolation trench 62, which meanders in the longitudinal direction. The semiconductor blocks 61a, 61b have comb-tooth-like projections 61c, 61d that interlock along the length of the array.

Each of these comb-tooth-like projections 61c, 61d includes a p-type semiconductor diffusion region 10 and an n-electrode 12. The p-type semiconductor diffusion regions 10 are aligned in a straight row relatively close to semiconductor block 61b; the n-electrodes 12 are aligned in a parallel row relatively close to semiconductor block 61a. The p-type semiconductor diffusion regions 10 and n-electrodes 12 disposed in the comb-tooth-like projections 61c of semiconductor block 61a constitute a first group of light-emitting elements 22. The p-type semiconductor diffusion regions 10 and n-electrodes 12 disposed in the comb-tooth-like projections 61d of semiconductor block 61b constitute a second group of light-emitting elements 22.

Anode interconnecting pads 13 with leads 13a, 13b, individual electrodes 14, individual interconnecting lines 15, shared interconnecting lines 16, 18, cathode interconnecting pads 17, 20, and interconnecting leads 19 are formed as in the first embodiment. The n-electrodes 12 in the first group of light-emitting elements 22 are electrically coupled to the first cathode electrode pad 17 by the individual interconnecting lines 15, the individual electrodes 14, the n-type semiconductor layer (which may have the same multilayered structure as the n-type semiconductor layer 7 in the first embodiment), and shared interconnecting line 16. The n-electrodes 12 in the second group of light-emitting elements 22 are connected to the second cathode interconnecting pad 20 through the interconnecting leads 19 and shared interconnecting line 18.

The LED array 61 in the fourth embodiment can be driven by the same method as in the first embodiment, so a description will be omitted.

The fourth embodiment provides the same effects as the first embodiment, but further increases manufacturing yields and therefore reduces the manufacturing cost, by reducing the number of points at which the interconnecting lines and leads cross the isolation trench. Specifically, the number of such crossings is reduced by half, as the intermediate interconnecting lines 15 and the second leads 13b of the anode interconnecting pads can be formed on flat surfaces not crossing the isolation trench 62.

Fifth Embodiment

Figure 19:
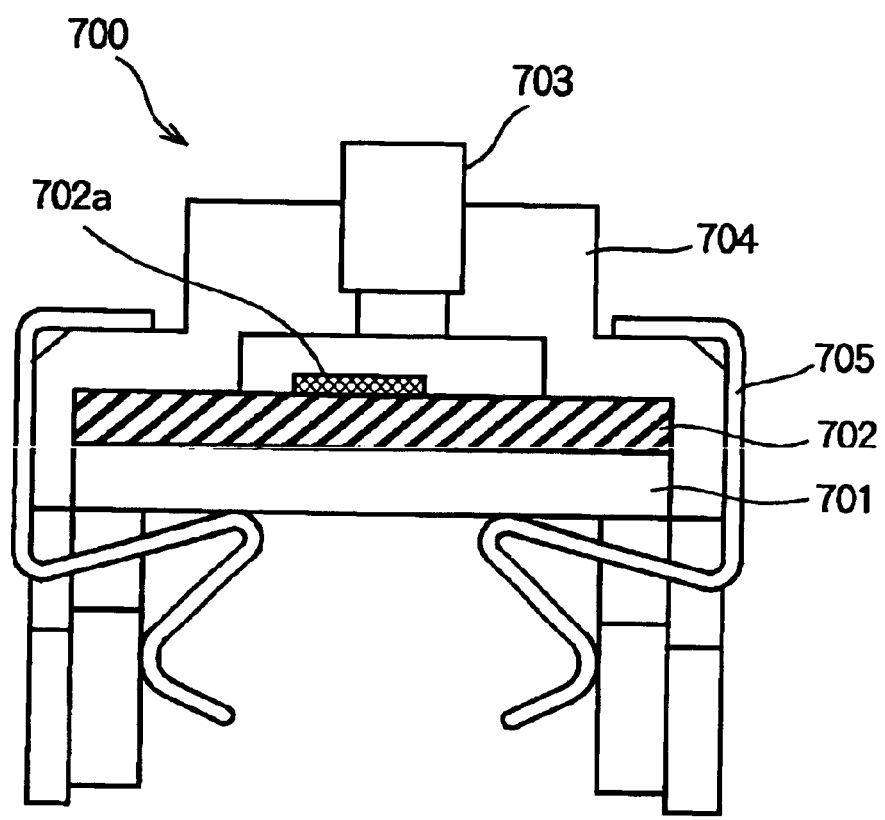
FIG. 19 is a sectional view of an LED printing head illustrating a fifth embodiment of the invention.

FIG. 19 shows an example of an LED printing head 700 embodying the present invention. The LED printing head 700 includes a base 701 on which an LED unit 702 is mounted. The LED unit 702 includes a plurality of LED arrays of the type described in any of the preceding embodiments, aligned end to end to form a single linear array of light-emitting elements. The LED unit 702 also includes driver ICs to which the LED arrays are electrically coupled by wire-bonding. The LED arrays and driver ICs are mounted in area 702a, the light-emitting elements being positioned beneath a rod lens array 703. The linear array is seen here in cross-section.

The rod lens array 703 is supported by a holder 704. The base 701, LED unit 702, and holder 704 are held together by clamps 705. Light emitted by the light-emitting elements in the LED unit 702 is focused by rod lenses in the rod lens array 703 onto, for example, a photosensitive drum (not shown) in an electrophotographic printer or copier.

Sixth Embodiment

Figure 20:
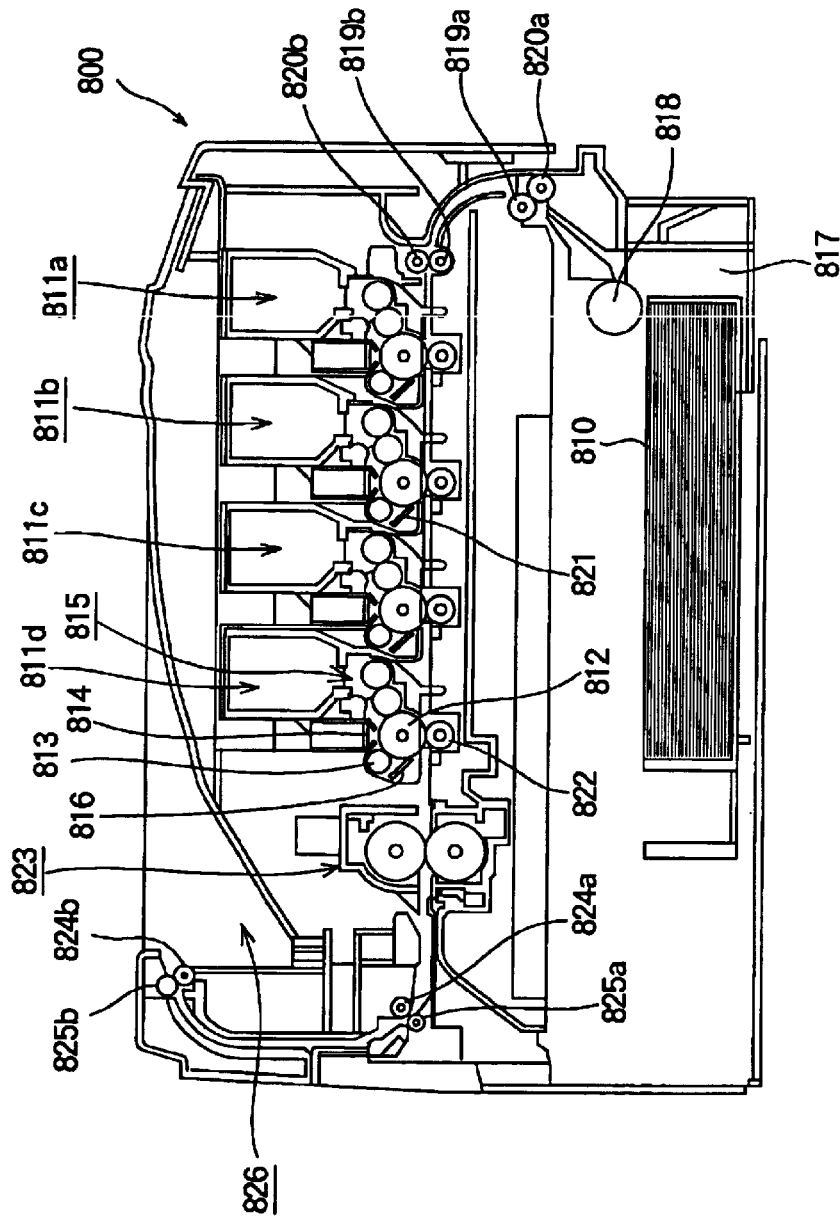
FIG. 20 is a sectional view of an LED color printer illustrating a sixth embodiment of the invention.
Figure 21:
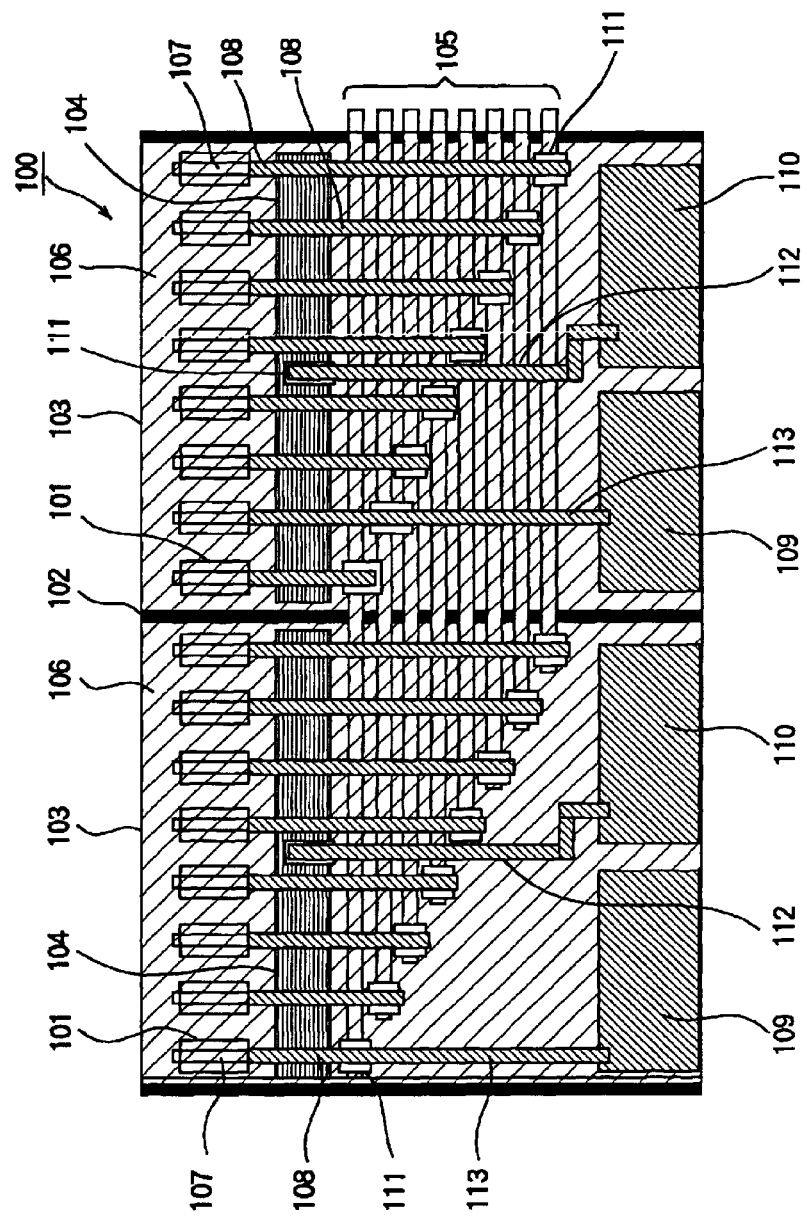
FIG. 21 is a plan view of a conventional LED array.

FIG. 20 shows an example of an LED color printer 800 embodying the present invention. The printer 800 sends printing media such as paper 810 through a yellow process unit 811a, a magenta process unit 811b, a cyan process unit 811c, and a black process unit 811d, which are mounted following one another in tandem fashion. Each process unit 811a, 811b, 811c, 811d includes a photosensitive drum 812, a charging unit 813 that supplies current to the photosensitive drum 812 to charge the surface thereof, an LED printing head 814 that selectively illuminates the charged surface of the photosensitive drum 812 to form an electrostatic latent image, a developing unit 815 that supplies toner particles to the surface of the photosensitive drum 812 to develop the electrostatic latent image, and a cleaning unit 816 that removes remaining toner from the photosensitive drum 812 after the developed image has been transferred to the paper 810. The LED printing head 814 has, for example, the structure described in the fifth embodiment, and includes LED arrays of the type described in any of the first four embodiments.

The paper 810 (or other media) is held as a stack of sheets in a cassette 817. A hopping roller 818 feeds the paper 810 one sheet at a time toward a paired registration roller 819a and pinch roller 820a. After passing between these rollers, the paper 810 travels to another registration roller 819b and pinch roller 820b, which feed the paper toward the yellow process unit 811a.

Guided by a paper guide 821, the paper 810 passes through the process units 811a, 811b, 811c, 811d in turn, traveling in each process unit between the photosensitive drum 812 and a transfer roller 822 made of, for example, semi-conductive rubber. The transfer roller 822 is charged so as to create a potential difference between the photosensitive drum 812 and the transfer roller 822. The potential difference attracts the toner image from the photosensitive drum 812 onto the paper 810. A full-color image is built up on the paper 810 in four stages, the yellow process unit 811a using yellow toner to print a yellow image, the magenta process unit 811b using magenta toner to print a magenta image, the cyan process unit 811c using cyan toner to print a cyan image, the black process unit 811d using black toner to print a black image.

From the black process unit 811d, the paper 810 travels through a fuser 823, in which a heat roller and back-up roller apply heat and pressure to fuse the transferred toner image onto the paper. A first delivery roller 824a and pinch roller 825a then feed the paper 810 upward to a second delivery roller 824b and pinch roller 825b, which deliver the printed paper onto a stacker 826 at the top of the printer.

The photosensitive drum 812 and various of the rollers are driven by motors and gears not shown in the drawing. The motors are controlled by a control unit (not shown) that, for example, drives registration roller 819a and halts registration roller 819b until the front edge of a sheet of paper 810 rests flush against registration roller 819b, then drives registration roller 819b, thereby assuring that the paper 810 is correctly aligned during its travel through the process units 811a, 811b, 811c, 811d. The registration rollers 819a, 819b, delivery rollers 824a, 824b, and pinch rollers 820a, 820b, 825a, 825b also have the function of changing the direction of travel of the paper 810.

The LED heads 814 account for a significant part of the manufacturing cost of this type of LED printer 800, and the density of the light-emitting elements in their LED arrays is a significant factor in the quality of the printed image. By enabling high-density LED arrays to be manufactured without the need for expensive, high-density wire bonding, the present invention enables high-quality printing to be obtained at a reasonable cost.

The invention is not limited to the preceding embodiments. For example, the anode and cathode designations and the p-type and n-type designations may be reversed, in which case the conductive type of each semiconductor layer is reversed.

The materials and compositions of the substrates, electrodes, and impurities are not restricted to those mentioned in the preceding embodiments; other materials providing the same effects may also be employed.

The invention is not limited to LED arrays. It can be practiced in other semiconductor devices, such as driver ICs, arrays of semiconductor lasers, and so on.

The first, third, and fourth embodiments are not limited to the use of solid-phase diffusion. The impurity (e.g., zinc) may be introduced into the semiconductor layer by various other methods, such as vapor-phase diffusion or ion implantation.

In the claims and the descriptions of the embodiments, terms such as "upper", "lower", and "left" are used for convenience; they do not restrict the absolute positional relationships of the component parts of the semiconductor array device in its deployed state.

Those skilled in the art will recognize that further variations are possible within the scope of the invention, which is defined in the appended claims.

What is claimed is:

1. A semiconductor array device having a semiconductor layer disposed on a current-blocking layer, the semiconductor layer being partly covered by a dielectric film, the semiconductor layer being divided into a plurality of mutually isolated parts, the semiconductor array device comprising:

a first interconnecting pad overlying and electrically coupled to one of the mutually isolated parts of the semiconductor layer;

a second interconnecting pad disposed on the dielectric film;

a first group of semiconductor circuit elements disposed in one or more of the mutually isolated parts of the semiconductor layer, having respective electrodes that are electrically coupled to the first interconnecting pad by first conductive paths passing through the semiconductor layer; and a second group of semiconductor circuit elements disposed in one or more of the mutually isolated parts of the semiconductor layer different from the parts in which the first group of semiconductor circuit elements are disposed, having respective electrodes that are electrically coupled to the second interconnecting pad by second conductive paths insulated from the semiconductor layer by the dielectric film, at least one of the second conductive paths crossing at least one of the first conductive paths at a point at which said one of the first conductive paths passes through the semiconductor layer.

2. The semiconductor array device of claim 1, wherein the first group of semiconductor circuit elements are interspersed among the second group of semiconductor circuit elements to form a substantially linear array of semiconductor circuit elements.

3. The semiconductor array device of claim 2, wherein the second conductive paths include a shared interconnecting line extending parallel to the substantially linear array, the shared interconnecting line crossing the first conductive paths at points at which the first conductive paths pass through the semiconductor layer.

4. The semiconductor array device of claim 3, wherein the second conductive paths also include respective interconnecting leads connecting the shared interconnecting line to the electrodes of the second group of semiconductor circuit elements.

5. The semiconductor array device of claim 4, wherein the first conductive paths include:

a plurality of individual electrodes disposed on and electrically coupled to the semiconductor layer on one side of the shared interconnecting line, between the interconnecting leads;

a plurality of individual interconnecting lines connecting the individual electrodes to the electrodes of the first group of semiconductor circuit elements; and a shared electrode disposed on and electrically coupled to the semiconductor layer on another side of the shared interconnecting line, extending parallel to the shared interconnecting line, the shared electrode being electrically connected to the first interconnecting pad, the shared electrode being electrically coupled to the individual electrodes through the semiconductor layer beneath the shared interconnecting line.

6. The semiconductor array device of claim 2, wherein the second conductive paths include a branched interconnecting line extending generally parallel to the substantially linear array, with branches leading to the electrodes of the second group of semiconductor circuit elements.

7. The semiconductor array device of claim 6, wherein at least one of the first conductive paths includes:

an electrode pad disposed between a pair of the branches of the branched interconnecting line, the electrode pad being electrically coupled to the first interconnecting pad through the semiconductor layer; and an interconnecting lead connecting the electrode pad to the electrode of one of the semiconductor circuit elements in the second group of semiconductor circuit elements.

8. The semiconductor array device of claim 6, wherein pairs of semiconductor circuit elements in the first group of semiconductor circuit elements alternate with pairs of semiconductor circuit elements in the second group of semiconductor circuit elements in the substantially linear array, further comprising:
 a plurality of electrode pads electrically interconnected through the semiconductor layer, disposed between respective pairs of branches of the branched interconnecting line, each electrode pad facing a pair of semiconductor circuit elements in the first group of semiconductor circuit elements; and
 a plurality of interconnecting leads connecting the electrode pads to the electrodes of the facing pairs of semiconductor circuit elements.

9. The semiconductor array device of claim 8, wherein the first interconnecting pad is disposed on one of the electrode pads.

10. The semiconductor array device of claim 2, wherein the substantially linear array has a staggered arrangement, the first group of semiconductor circuit elements and the second group of semiconductor circuit elements being offset in mutually opposite directions.

11. The semiconductor array device of claim 2, wherein each semiconductor circuit element in the first and second groups of semiconductor circuit elements is disposed in a separate one of the mutually isolated parts of the semiconductor layer.

12. The semiconductor array device of claim 2, wherein the first group of semiconductor circuit elements is separated from the second group of semiconductor circuit elements by a meandering trench dividing the semiconductor layer into two mutually isolated parts.

13. The semiconductor array device of claim 2, wherein the first interconnecting pad and the second interconnecting pad are disposed on one side of the substantially linear array, further comprising a plurality of third interconnecting pads disposed on the dielectric film on another side of the substantially linear array, each of the third interconnecting pads being electrically coupled to a mutually adjacent pair of the semiconductor circuit elements, one semiconductor circuit element in the mutually adjacent pair belonging to the first group, another semiconductor circuit element in the mutually adjacent pair belonging to the second group.

14. The semiconductor array device of claim 13, wherein the semiconductor layer includes:
 a lower cladding layer of aluminum gallium arsenide;
 an active layer of aluminum gallium arsenide disposed on the lower cladding layer of aluminum gallium arsenide;
 an upper cladding layer of aluminum gallium arsenide disposed on the active layer of aluminum gallium arsenide; and
 a contact layer of gallium arsenide, disposed on the upper cladding layer of aluminum gallium arsenide, making electrical contact with the electrodes of the semiconductor circuit elements.

15. The semiconductor array device of claim 14, wherein the semiconductor circuit elements have impurity diffusion regions, and the third interconnecting pads have leads making electrical contact with the contact layer of gallium arsenide in the impurity diffusion regions.

16. The semiconductor array device of claim 13, wherein the semiconductor layer includes:
 a lower contact layer of n-type gallium arsenide making electrical contact with the electrodes of the semiconductor circuit elements;
 a lower cladding layer of n-type aluminum gallium arsenide disposed on the lower contact layer of n-type gallium arsenide within parts of the semiconductor circuit elements excluding the electrodes of the semiconductor circuit elements;
 an active layer of aluminum gallium arsenide disposed on the lower cladding layer of n-type aluminum gallium arsenide;
 an upper cladding layer of p-type aluminum gallium arsenide disposed on the active layer of aluminum gallium arsenide; and
 an upper contact layer of p-type gallium arsenide disposed on the upper cladding layer of p-type aluminum gallium arsenide;
 the third interconnecting pads having leads making electrical contact with the upper contact layer of p-type gallium arsenide in the semiconductor circuit elements.

17. An optical printing head comprising at least one semiconductor array device as recited in claim 1.

18. The optical printing head of claim 17, wherein the semiconductor circuit elements in the semiconductor array device are light-emitting elements, further comprising:
 a base for supporting the semiconductor array device;
 a rod lens array for focusing the light emitted by the light-emitting elements in the semiconductor array device;
 a holder for holding the rod lens array; and
 at least one clamp for holding the base and the holder together.

19. An electrophotographic printer comprising at least one optical printing head having at least one semiconductor array device as recited in claim 1.

20. The electrophotographic printer of claim 19, further comprising:
 a photosensitive drum selectively illuminated by the optical printing head to form a latent electrostatic image;
 a developing unit for supplying toner to develop the latent electrostatic image on the photosensitive drum; and
 a transfer roller for transferring the developed image from the photosensitive drum to printing media.

\* \* \* \* \*

UNITED STATES PATENT AND TRADEMARK OFFICE
CERTIFICATE OF CORRECTION

PATENT NO. : 6,781,246 B1
DATED : August 24, 2004
INVENTOR(S) : Stiesdal et al.

It is certified that error appears in the above-identified patent and that said Letters Patent is hereby corrected as shown below:

Title page,
Item [73], Assignee, "Bonus Enegy A/S" should read -- Bonus Energy A/S --.

Signed and Sealed this

Fourteenth Day of December, 2004

JON W. DUDAS
*Director of the United States Patent and Trademark Office*